United States Patent [19]
Li

[11] Patent Number: 6,071,340
[45] Date of Patent: Jun. 6, 2000

[54] APPARATUS FOR MELT-LEVEL DETECTION IN CZOCHRALSKI CRYSTAL GROWTH SYSTEMS

[75] Inventor: Zhixin Li, Hudson, N.H.

[73] Assignee: General Signal Technology Corporation, Stamford, Conn.

[21] Appl. No.: 08/807,036

[22] Filed: Feb. 27, 1997

Related U.S. Application Data

[60] Provisional application No. 60/012,393, Feb. 28, 1996.

[51] Int. Cl.$^7$ ................................................ C03B 35/00
[52] U.S. Cl. ............................ 117/201; 117/14; 117/202
[58] Field of Search ............................ 117/14, 15, 201, 117/202, 900

[56] References Cited

U.S. PATENT DOCUMENTS

| | | | |
|---|---|---|---|
| 4,508,970 | 4/1985 | Ackermann | 117/202 |
| 4,915,775 | 4/1990 | Katsuoka et al. | 117/202 |
| 5,408,952 | 4/1995 | Wakabayashi et al. | 117/201 |
| 5,660,629 | 8/1997 | Shiraishi et al. | 117/201 |

Primary Examiner—Felisa Hiteshew
Attorney, Agent, or Firm—Kudirka & Jobse, LLP

[57] ABSTRACT

A method of and system for determining the melt-level in a crystal growing system. A rangefinder emits a signal to reflect off the melt. The reflected signal is directed to a retroreflector. The retroreflector redirects the signal along a parallel path back to the melt surface. The redirected signal is reflected off the melt surface back to the rangefinder, where it is analyzed to determine the distance traveled by the signal. From this, changes in melt-level are determined and the melt-level may be appropriately controlled.

10 Claims, 9 Drawing Sheets

2D ARRAY DETECTOR

1D ARRAY DETECTOR

APPARATUS FOR MELT-LEVEL DETECTION IN CZOCHRALSKI CRYSTAL GROWTH SYSTEMS

Verified Provisional application No. 60/012,393 filed Feb. 28, 1996.

FIELD OF THE INVENTION

This invention relates to crystal growing systems and, more particularly, to a method of, and apparatus for, detecting a melt-level within a crucible of a crystal growing system.

BACKGROUND OF THE INVENTION

The Czochralski (CZ) process is probably the most widely used technique for growing crystal ingots used in the manufacture of IC chips. In the CZ process, a "crystal puller" system grows solid, crystal ingots from a melted form of charge material. High-quality ingots are substantially free of defects, have a uniformity of characteristics throughout the ingot, and are largely uniform from one ingot to the next.

A modern crystal puller typically includes a growth chamber, containing a crucible, heated by a furnace. The crucible holds a charge material, such as silicon, and the furnace heats the charge to a melted state (the "melt"). A crystal lifting mechanism holds a "seed" at the end of the rod or cable and lowers the seed to contact the melt. Upon contacting the melt, the seed causes a local decrease in melt temperature, which causes a portion of the melt to crystallize around the seed. The seed is then slowly raised out of the melt by the lifting mechanism. As the seed is withdrawn, the portion of the newly-formed crystal that remains within the melt essentially acts as an extension of the seed and causes more melt to crystallize around the seed and crystal. The lifting is continued until the ingot is grown to the desired size.

To grow high-quality, defect-free ingots, modern crystal pullers are essentially hermetic. Any contaminants introduced into the melt can cause crystal defects. Thus, for example, special seals, known in the art, are used prevent contaminants from entering the growth chamber through various conduits into the chamber, such as the conduit for the lifting cable.

Moreover, to grow high-quality, defect-free ingots, modern crystal pullers monitor and control various growth parameters. For example, a control system controls the rate at which the lifting mechanism raises the crystal, and the rate at which the crystal and crucible are rotated.

One of the growth parameters of particular importance are the thermogradients at the melt/crystal interface. Changes in the thermogradients at the melt/crystal interface are known to affect crystal quality. Thus, it is believed to be desirable to keep the thermogradients uniform during the growing process.

Unfortunately, controlling the thermogradients has proven to be difficult, as the crystal growing process itself affects the thermogradients. In short, the crystal growing process effectively removes melt from the crucible and adds it to an ingot. Without more, this transfer of material from the melt to the ingot will lower the melt-level and, in turn, change the thermogradients at the melt/crystal interface.

To control the melt-level, the art has used two general approaches. One approach raises the crucible so that the melt surface in the crucible maintains a substantially absolute level, even though the melt-level will vary relative to the crucible. Another approach adds charge material to the crucible so that the melt-level substantially maintains an absolute level and also maintains the same relative level within the crucible.

To be effective, each of the above approaches requires knowledge of the melt-level so that the appropriate control may be made. That is, both of the above general approaches require knowledge of the melt level before either the crucible is raised or charge material is added.

To determine the melt-level, several systems have been proposed. For example, one type of system assumes that the melt volume will decrease at a rate related to the known rate at which the seed is raised by the lifting mechanism. Another proposal uses an electrical circuit that includes a platinum rod to directly contact the melt surface; the characteristics of the circuit depend upon the amount of platinum rod used. Each of these systems has its unique disadvantages, such as inaccurate estimations or risk of contamination.

Another technique uses a laser and light detection system to directly monitor the melt-level. The laser technique provides relatively accurate estimates of the melt-level and essentially no risk of introducing contaminants to the melt.

More particularly, referring to FIG. 1A, with the laser technique, a light source 1 emits a light beam toward the melt 2. The light beam reflects upward off the melt toward a light detection system 3. As can be readily seen, because the melt-level partially defines the geometry of the system, the position at which the light beam strikes the detection system 3 depends on the melt-level.

Unfortunately, actual melt systems are not as simple as the flat surface model of FIG. 1A. Rather than having a flat surface, actual melt systems have surfaces that undulate, as suggested in FIG. 1B. The undulations are a consequence of the dynamics of the system and of inherent properties of the system and materials. Typically those undulation have a frequency in the range of about 10–100 HZ and a height in the range of about 1–10 inches. Moreover, it is now believed that at least some of these undulations cannot be feasibly prevented. Consequently, a truly useful system must account for the undulations when determining the melt-level.

FIG. 1B illustrates a somewhat more accurate model of the melt system, including an undulating melt surface 5. As is seen in FIG. 1B, the angle $\alpha$ (measured from the normal z) at which the light beam reflects off the melt surface depends upon the melt-level and also upon what portion of a surface wave the beam contacts. Because the undulating surface is a time-varying signal having a time-varying component $\Delta\alpha$, the angle of reflection is also a time-varying signal, having a time-varying component $2\Delta\alpha$. Referring to FIG. 1C, it can be seen that the angle of reflection not only varies along the Y, but also along the X direction. Consequently, over a given time period, the reflected light beam moves about within a given area, called a target area, shown as area 25 in FIG. 2. The pattern 20 represents the time-elapsed trajectory of a hypothetical reflected light beam and is essentially a random pattern that falls within target area 25.

The trajectory 20 is sampled by the detector 3, which provides information indicating where the light beam strikes the detector. A control system (not shown) analyzes the information to determine an average position of the reflected beam and to thereby estimate the melt-level. The average position, in effect, is a "DC"-like component of the melt and the ripples are an "AC"-like component.

Typical prior art light detection systems 3 use discrete sensor elements in two basic configurations: FIG. 3A, for example, illustrates a conventional two-dimensional (2-D) arrangement 30 of sensor elements 31; and FIG. 3B, on the other hand, illustrates a conventional one-dimensional (1-D) arrangement 35. Although these light detection systems have proven useful, certain shortcomings have recently been appreciated. For example, because the target area 25 can be somewhat large, the light detector array 3 must also be large to avoid the risk of missing samples of information.

A large size array 30 requires more sensor elements to "capture" the reflected light. The larger number of elements increases the cost of the system and also reduces reliability, as there are more elements that can fail.

Alternatively, an undersized array 35 (see FIG. 5) may be used but, as readily seen increases the risk of missing samples of information. This will reduce the confidence in the information provided by the detections system. In order to overcome this drawback another prior art system disclosed in U.S. Pat. No. 5,286,461, uses a linear detector 35 which does not cover the entire target area. Light from source 400 is reflected off the melt surface and passes through an aperture 40 in a barrier 415. The light that passes through the aperture 40 also passes through a band-pass filter to eliminate the light emitted by the hot melt surface. The remaining light which is indicative of the reflected light beam, impinges on the detector 35.

Linear detector 35 indicates not only when a light beam is incident on it, but also indicates where the beam strikes the detector. Thus, as shown in FIG. 5, which indicates the sensor 35 located in the target area 25, the sensor will only produce and output when the beam is incident on the sensor and the output will be indicative of the vertical position on the sensor 35. A computer system (not shown) is utilized to implement an algorithm that processes the output signals from the detector which are continually sampled over time. The algorithm disregards the location data sent from the detector if it determines that the light beam was not incident on the detector for a given sample. By analyzing location data only for samples generated when the light beam was incident on the detector the algorithm determines an average location of the melt level for a predetermined number of samples and assumes that this average is representative of the location of the actual melt level. This system improves over the previous prior art systems, but the linear sensor is expensive and the system requires a significant time and computing power to average the samples and produce a result.

Accordingly, it is an object of the present invention to provide an improved method and apparatus for determining the melt-level within a crucible utilized in a crystal growing system.

SUMMARY OF THE INVENTION

In accordance with the principles of the invention, the melt level is determined by making a distance measurement that is indicative of the melt-level. The distance measurements are processed to determine an average melt-level so that it may be controlled accordingly.

One embodiment includes a rangefinder that is oriented to emit signals at a melt surface. The emitted signals are reflected from the surface toward a retroreflector. The retroreflector is oriented to receive signals reflected from the surface and to redirect the signals that it receives along a parallel to the path of the received signal path. Given the geometries of a crystal puller system in comparison to the speed of light and in consideration of the expected surface characteristics of the melt, the redirected signal is expected to be reflected off the melt surface back to the rangefinder. The rangefinder analyzes the received signal to determine the distance traveled by the signal. From this determination, changes in melt-level may be determined from the trigonometric relationships of the arrangement. These detected changes may then be used to control the melt-level accordingly.

DETAILED DESCRIPTION OF THE PREFERRED EMBODIMENT

The preferred embodiment of the invention determines a melt-level in a crucible by measuring a distance, indicative of the melt-level. Consequently, the invention directly monitors the melt surface, rather than assuming that the melt-level changes in some relationship to other known rates. Moreover, the invention reduces risk of contamination by measuring the distance passively, i.e., not introducing any physical entities to contact the melt.

The improved detection system improves the accuracy of the estimates of the melt-level, provides the ability to attain absolute measurements; is more sensitive to changes in the melt-level in that it provides a higher signal to noise ratio, and provides a faster response time than that provided by the art. The range finder provides a higher signal noise ratio since it detects and displays the strength (db level) of each signal. The signal reflected by the retro reflector has a certain db level which is different from the noises (typically the signal has higher db level). Thus, in the measurement, only the signal with the right db level is used for measurement purpose so that the signal is separated from the noise thereby to reduce the noise level in the final output. In addition, the large area of the retro reflector sends more useful signals back in a fixed time interval. Thus the average signal strength in the interval is stronger. The range finder system is less sensitive to the ripple of the melt and other misalignments compared with the conventional laser detector system. Thus the noise caused by these effects are smaller.

The use of a rangefinder in the present invention also is advantageous since the ripple detection is not important to the crystal growing process, but the level detections. The rangefinder is insensitive to the ripple (noise) but sensitive to the level (signal), which also improves its signal to noise ratio and measurement accuracy. In contrast, the conventional laser system noise is sensitive to the ripple which need to be filtered out.

Figure 6A:
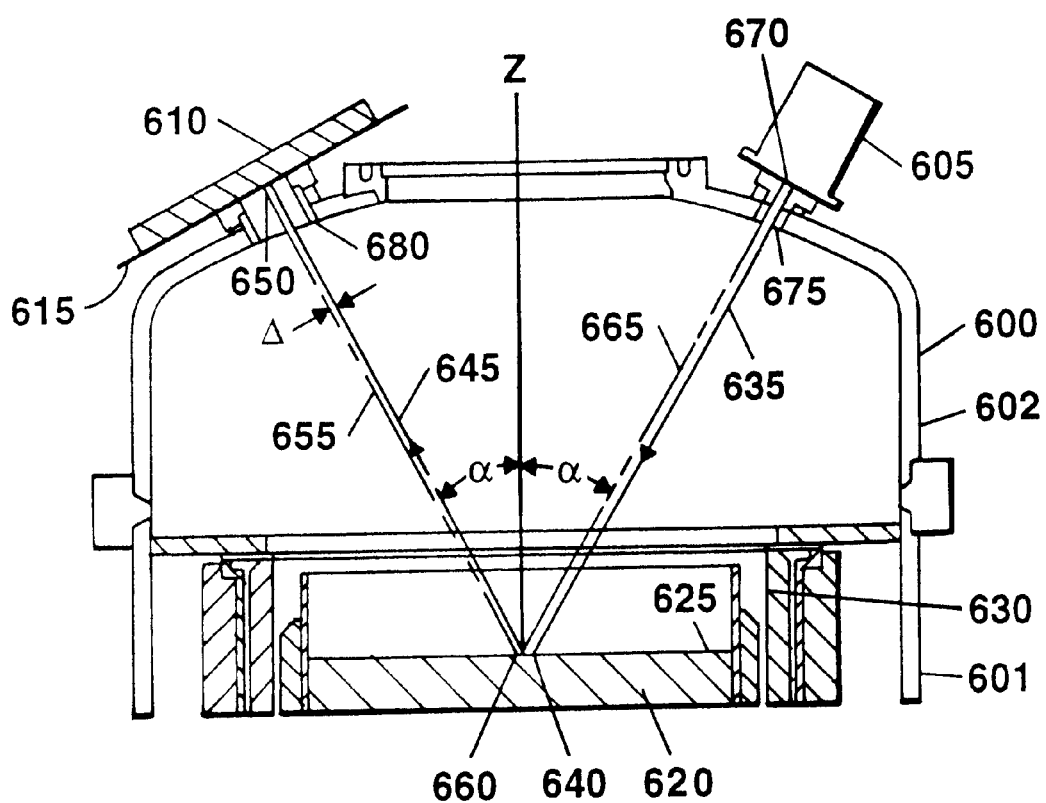
FIGS. 6A–B illustrate an exemplary embodiment of the invention.
Figure 6B:
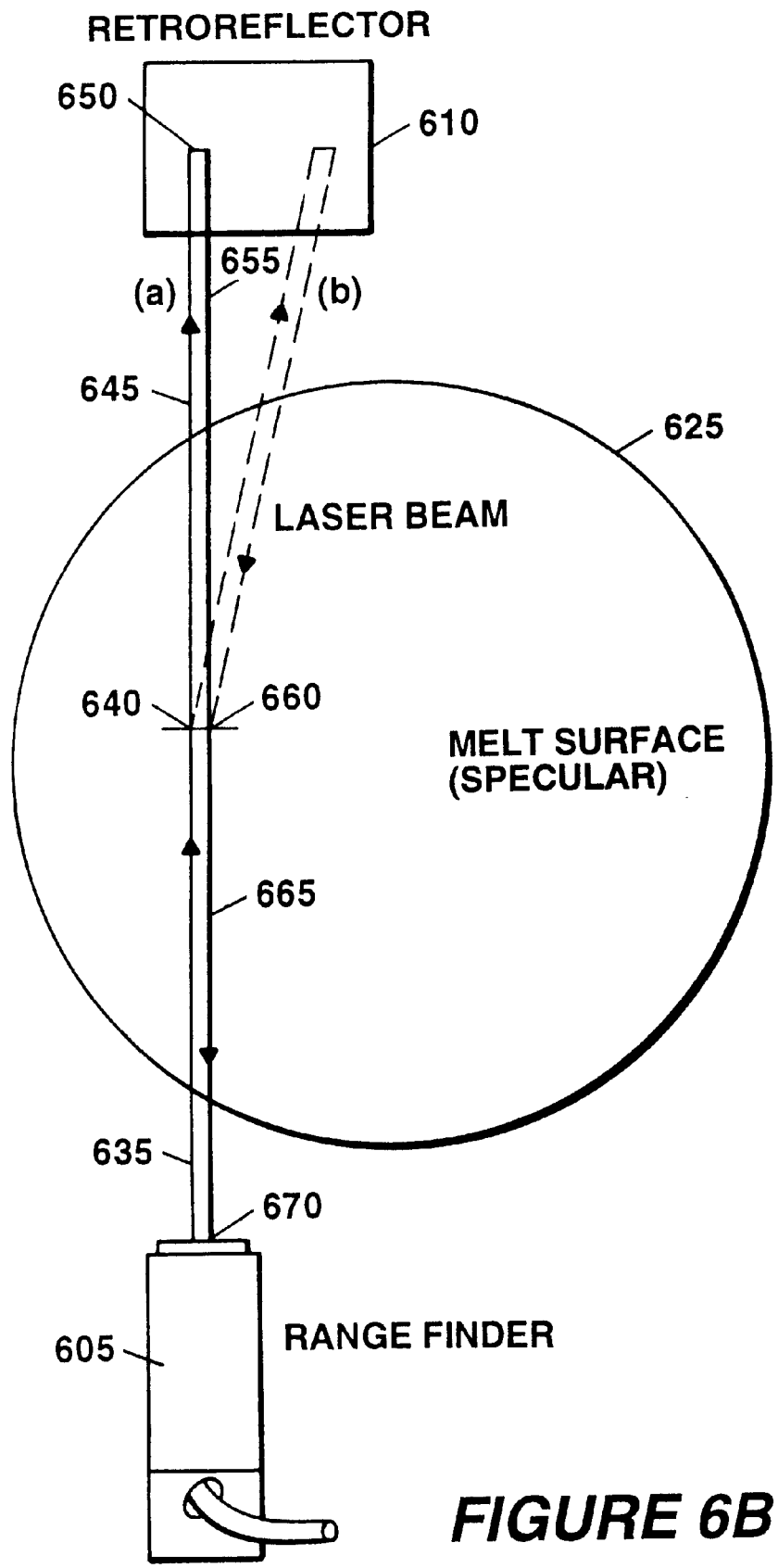

An exemplary embodiment of the invention is described with reference to FIGS. 6A and 6B, which, respectively illustrate a partial cross-section of a crystal puller 600, including a growth chamber 601 and transition region 602 and a cutaway top view of the crystal puller illustrating the melt surface. Other elements of the crystal puller 600, such as the receiving chamber, furnace, and hoists, are not illustrated because they are immaterial to understanding the invention.

Crystal puller 600 includes crucible 630, which holds the melt 620, which, in turn, is heated by a furnace (not shown). In this example, the crucible 630 may be raised and lowered by a lift mechanism controlled by a control system (not shown).

A rangefinder 605 and retroreflector 610 are mounted on the exterior of the crystal puller 600. By mounting the rangefinder and retroreflector on the exterior of the crystal puller 600, the rangefinder 605 and retroreflector 610 are largely insulated from the extreme temperatures and hostile environment within the growth chamber 601. Moreover, by mounting the rangefinder 605 and the retroreflector 610 on the exterior of the crystal puller 600, they are incapable of contaminating the melt 620. View ports 675 and 680, are made from a material, such as quartz, which enables laser light to pass therethrough and which also withstands the extreme temperatures within the growth chamber 601.

An exemplary rangefinder 605 is a DME 2000 rangefinder, available from Sick Corp. of Germany, which, like other rangefinders, measures distance using the principle of phase-shift measurement to determine a distance. More particularly, the rangefinder emits a light pulse and analyzes the reflected light, with known techniques, to determine the distance that the reflected light traveled.

Figure 7A:
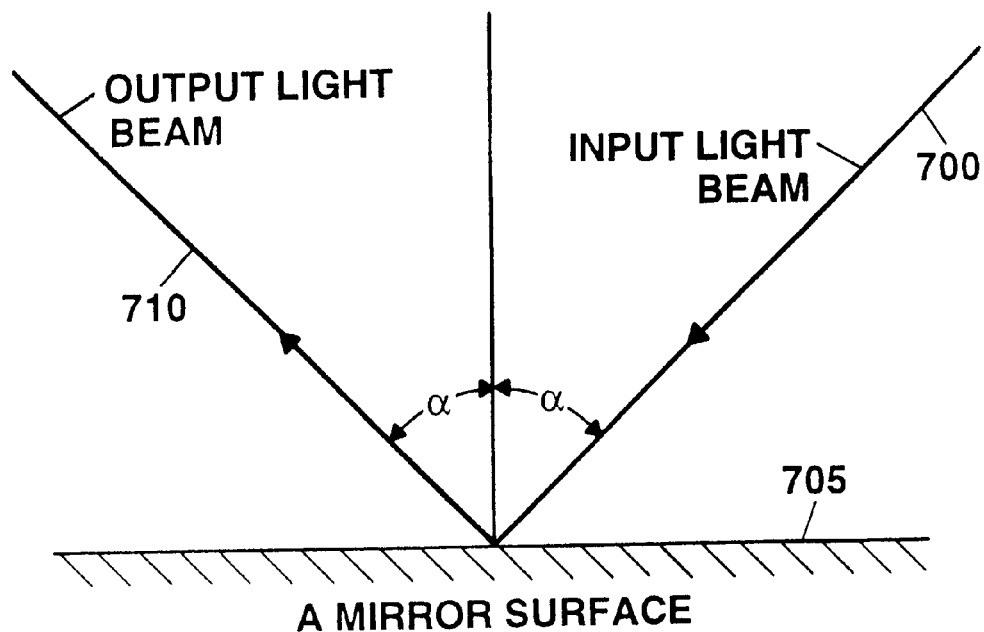
FIGS. 7A–B illustrate the principles of a mirror surface and a retroreflective surface.
Figure 7B:
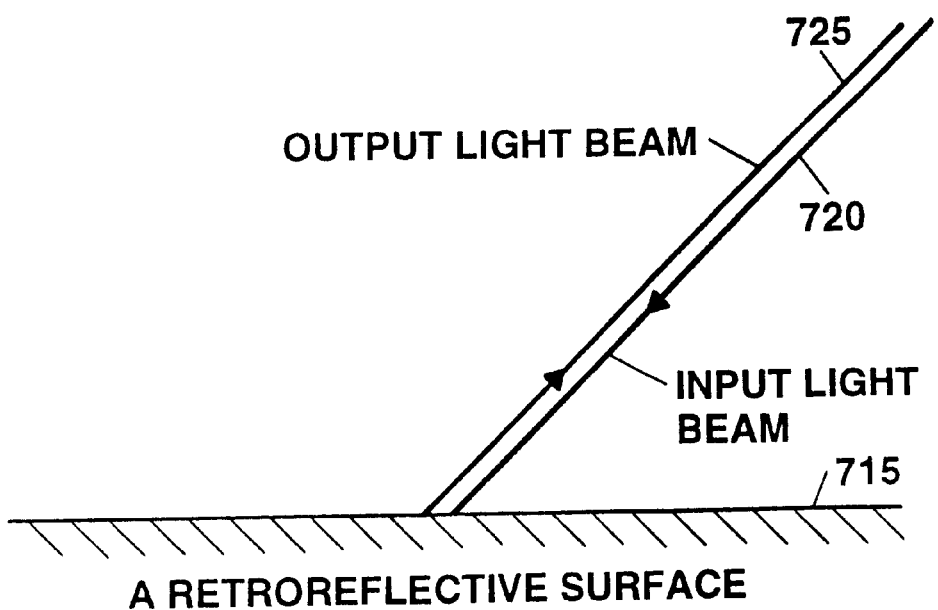

Retroreflector 610, like known retroreflectors, reflects light along a path that is parallel to the incident ray. More particularly, FIG. 7B illustrates the reflective properties of a retroreflector, while FIG. 7A illustrates the reflective properties of a mirror surface. In FIG. 7A, an input light beam 700 is reflected from surface 705 at equal angles α to produce the output light beam 710. On the other hand, as shown in FIG. 7B, a retroreflective surface 715 reflects input beam 720 along a path 725 parallel to the input beam 720.

Figure 3A:
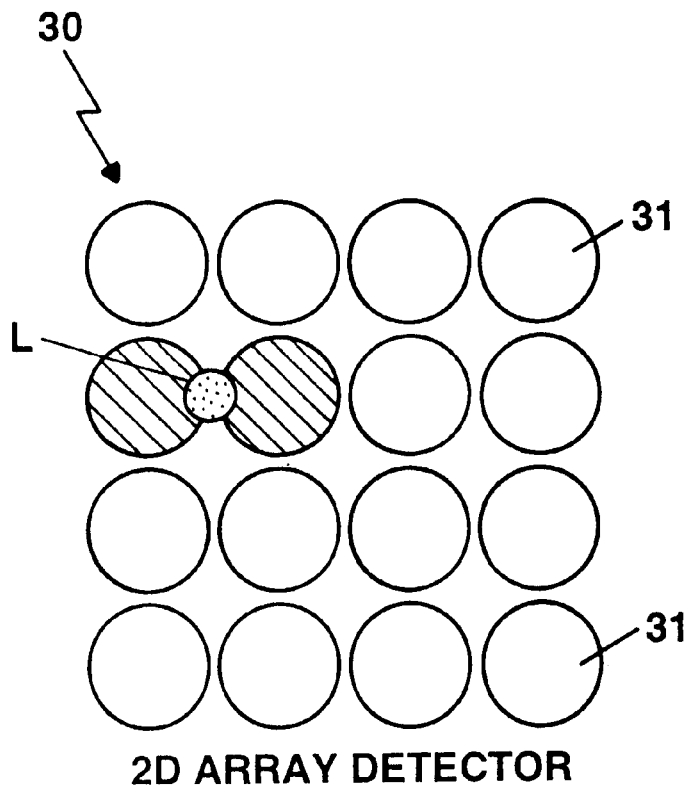
FIGS. 3A–3B illustrate a photo-detection system of a prior art melt-level detection system.
Figure 3B:
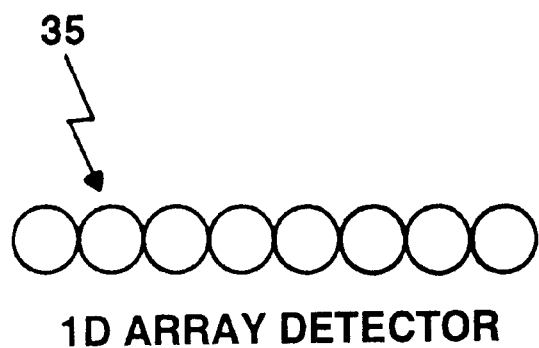
Figure 4:
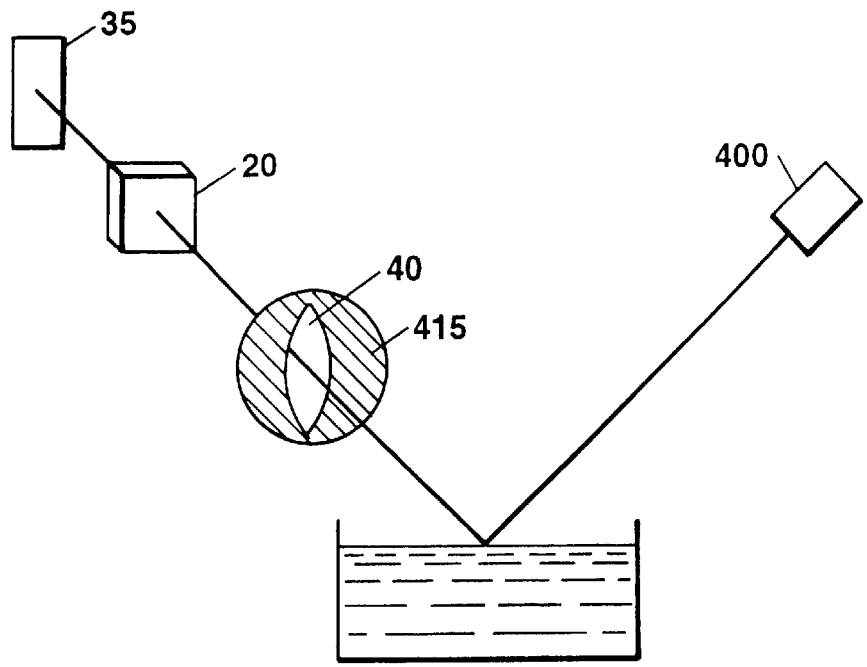
FIG. 4 illustrates another prior art melt-level detection system.
Figure 5:
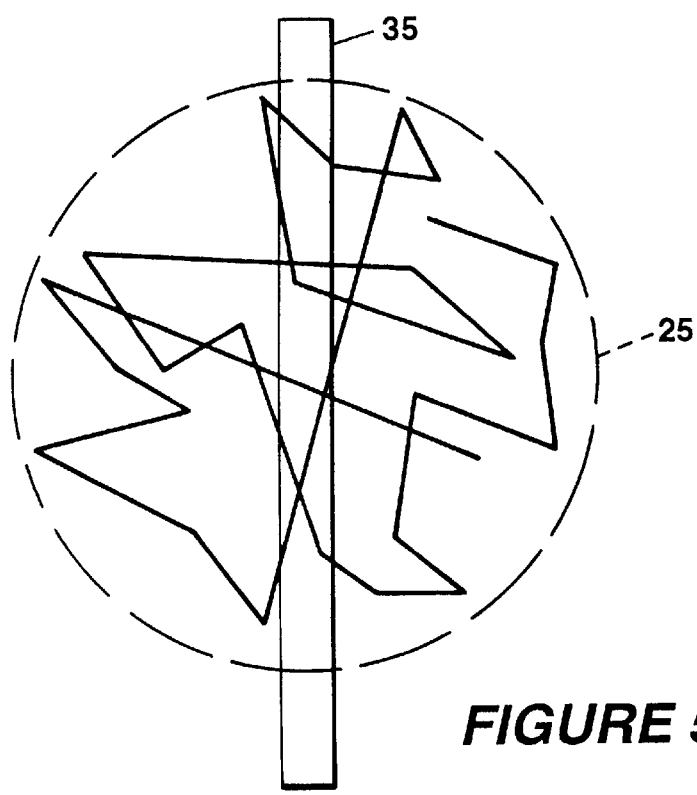
FIG. 5 is an exemplary laser trace from a reflected beam of the melt-level detection system of FIG. 4.

Referring back to FIGS. 6A and 6B, exemplary retroreflector 610 is large enough to monitor the entire expected target area coverage of the entire expected target area is feasible due to its relatively low cost, in comparison to photodetector arrays, discussed with reference to FIGS. 3A–B or the linear detector illustrated in FIGS. 4 and 5. Thus, the exemplary retroreflector 610 can capture all expected reflected beams and can provide an average melt-level determination while providing a high degree of confidence in the measurements so-obtained.

The rangefinder 605 and retroreflector 610 optically communicate as follows. The rangefinder 605 emits a pulse of light, indicated by ray 635. The light ray 635 strikes melt surface 625 at point 640, where the light is reflected as ray 645. Rays 635 and 645 are at an angle α relative to normal axis z. The reflected light 645 strikes retroreflector surface 610 at point 650, where the light is reflected back as ray 655. Ray 655 is parallel to ray 645, because of the retroreflective properties of retroreflector 610. Ray 655 hits the melt surface 625 at point 660, where the light is reflected as ray 665 towards rangefinder 605. Because ray 645 and 655 are parallel, rays 635 and 665 are expected to be nearly parallel. Ray 665 strikes the rangefinder at point 670. The above communication paths are shown in plan view in FIG. 6B, which illustrates that the principles of this invention apply when the light ray is reflected in the Y as well as the X directions.

Rays 665 and 635 are expected to be nearly parallel and are not assured, theoretically, of being definitely parallel for the following reasons. First, rays 635 and 645 strike, and emanate from, the melt surface at point 640, while rays 655 and 665 strike, and emanate from, the melt surface at point 660. Points 640 and 660 may have different surface profiles, thus causing non-parallel rays which might differ from each other by a small angle Δ. Moreover, the undulations are time-varying, so even if the rays strikes the same point, the profile at that point will vary in the amount of time between forward and return trips. In reality, the degree of "non-parallelness", or the angle Δ, is expected to be so small that the effect to the system is negligible. This is so, because (a) the distance between the rays is so small that the profiles at points 640 and 660 should be highly similar and (b) the geometry of the system is so small in relation to the speed of light and the expected frequencies of the undulations that the profiles are not expected to vary much in the time involved between the forward and return trips.

As explained above, the rangefinder 605, upon receiving the reflected beam 665, determines the round-trip distance (L) traveled by beam 635. The measured distance is used to determine the melt-level from considering the rest of the geometry of the system.

Figure 8:
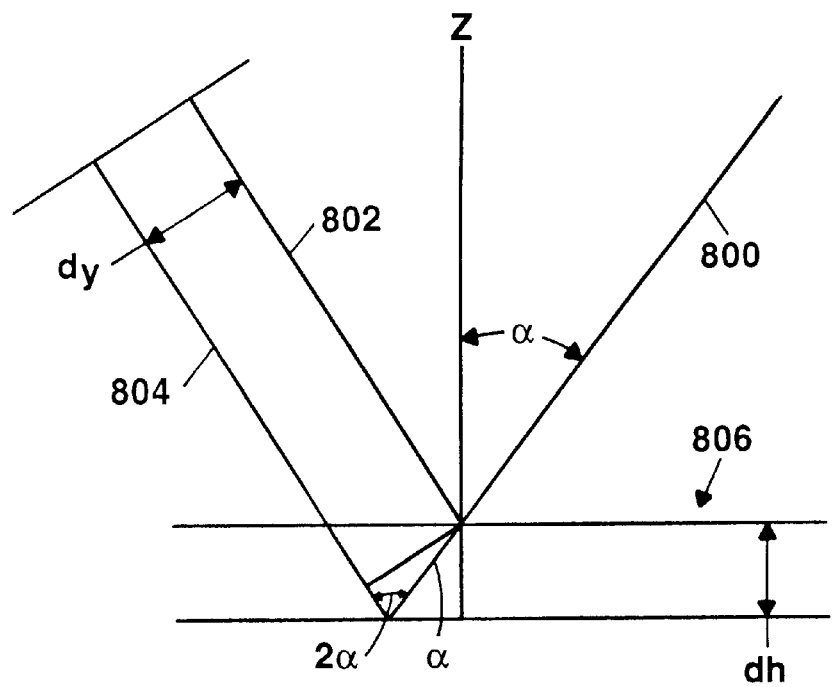
FIG. 8 illustrates a set of trigonometric relationships, comparing the invention and the art.

The manner in which the melt-level is determined from the distance L and the geometry of the system is described with reference to FIG. 8. FIG. 8 illustrates an input light beam 800 and two output light beams 802 and 804 which result from a change dh in the melt surface 806. Changes in distance L, i.e., dL, may be related to changes in the melt-level, i.e., dh, with the following trigonometric relationship:

$$dL = dh \frac{1 + \cos 2\alpha}{\cos \alpha}$$

dL is determined from the rangefinder by comparing successive measurements, and α is known from the system design and the fixed configuration of the rangefinder and retroreflector. Thus, changes in melt-level dh may be determined without having any other information.

Figure 1A:
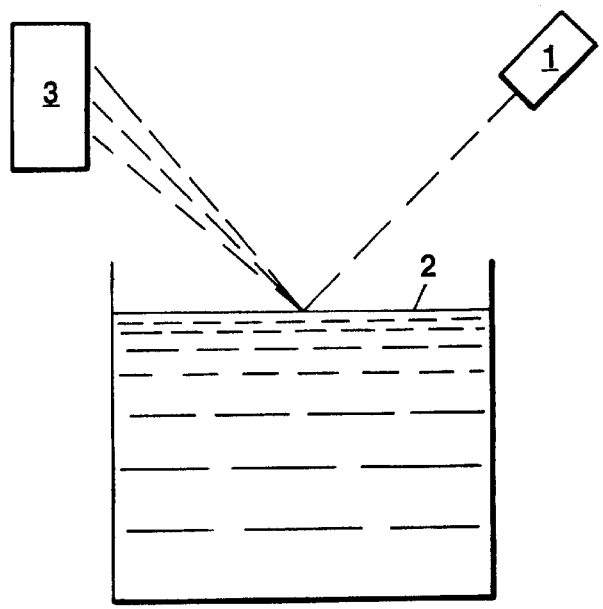
FIGS. 1A–1C illustrate a prior art melt-level detection system.
Figure 1B:
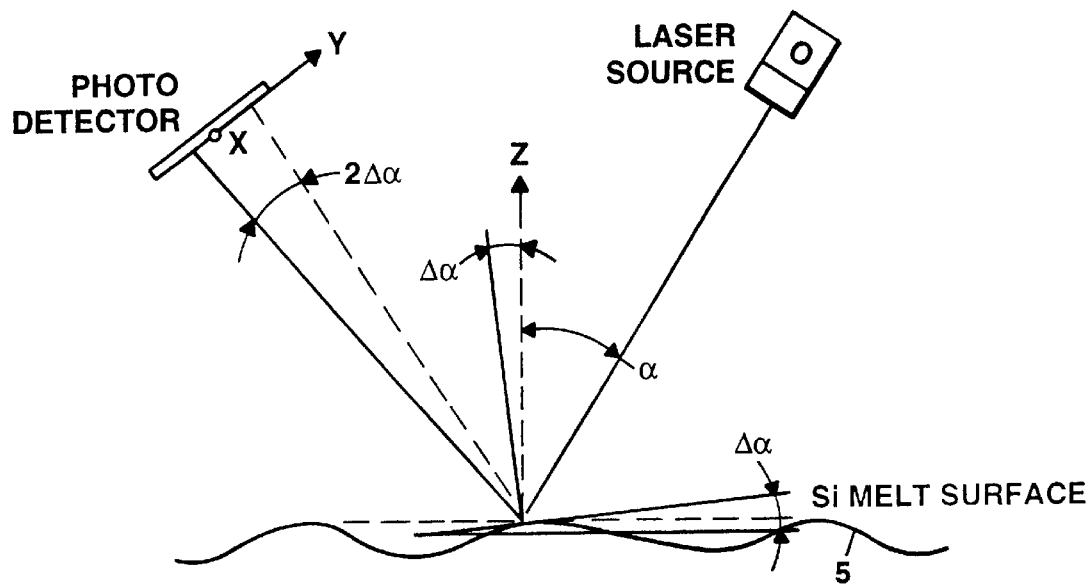
Figure 2:
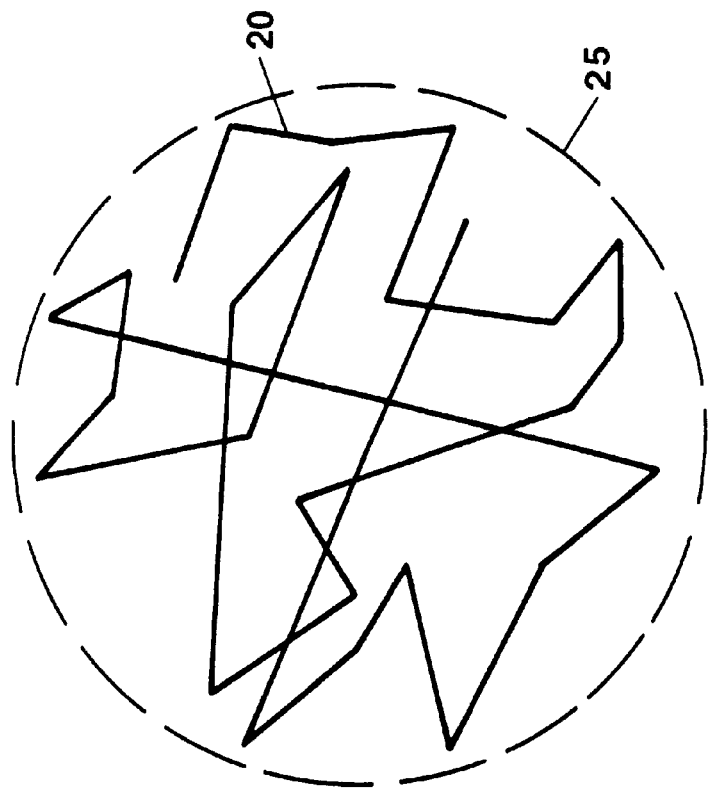
FIG. 2 illustrates an exemplary laser trace from a reflected beam of the melt-level detection system of FIGS. 1B and 1C.
Figure 1C:
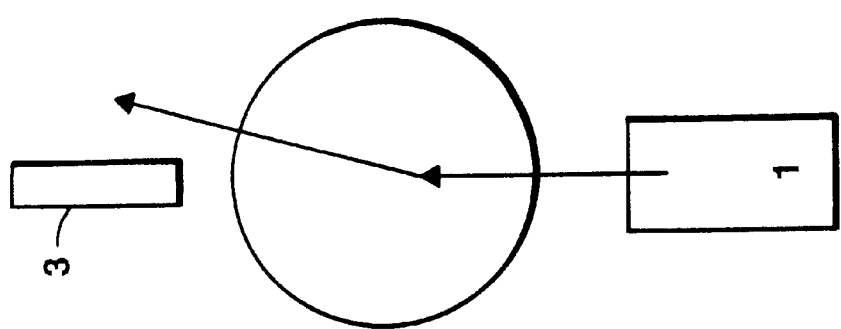

On the other hand, the analogous relationship of the prior art system of FIGS. 1A–1C can be described with the following formula:

$$dy = dh \frac{\sin 2\alpha}{\cos \alpha}$$

where dy is the change in the position of the reflected light spot at the detector as indicated in FIG. 8.

The melt level estimate developed by the inventive rangefinder system is dependent on the accurate determination of the length L. Comparing the above equations over a range of typical a values (i.e., in the vicinity of 30 degrees), the length L, as measured by the rangefinder arrangement of FIG. 6, is more than twice as sensitive to changes in melt-level as the change in spot position on which the prior art system of FIGS. 1A–1C are based. (For a equal to 26 degrees, for example, the rangefinder is 2.05 times more sensitive to changes in the melt-level.) Thus, any estimates made by the system will be more accurate.

Figure 9:
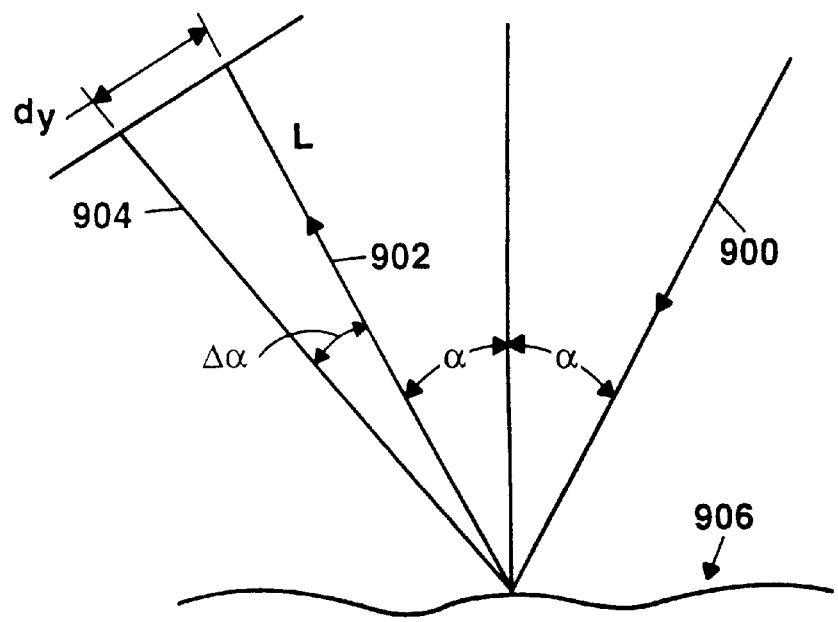
FIG. 9 illustrates another set of trigonometric relationships, comparing the invention and the art.

While FIG. 8 helps explain the sensitivity of this invention to changes in melt-level, FIG. 9 helps explain the sensitivity of this invention to the angular deviation of the laser beam. FIG. 9 illustrates an input light beam 900 and two output light beams 902 and 904 which result from a change in the angle of the melt surface 906 due, for example, to a ripple. In some sense, this is a measure of the reliability and quality of the design, as it describes the sensitivity to the imprecision in placing the rangefinder, i.e., a manufacturing tolerance. In another sense, this is a measure of robustness of the system with regard to the ripples on the surface. As shown in FIG. 9, $\alpha$ is not constant and actually depends on the surface profile of the melt where the laser strikes.

The sensitivity to the length measurement of the rangefinder (dL) can be described as follows:

$$dL = \frac{(1 - \cos\Delta\alpha)L}{\sin\Delta\alpha}$$

On the other hand, the sensitivity of the sensor system of FIGS. 1A–1C can be described as follows:

$$dy = L \tan \alpha$$

Given n data points for obtaining an average measurement (i.e., to cancel the effect of the ripples), the accuracy is proportional to $n^{1/2}$. Consequently, for typical system geometries, one distance measurement by the invention is equivalent to thousands of position measurements in the laser system of FIGS. 1A–1C.

Figure 10:
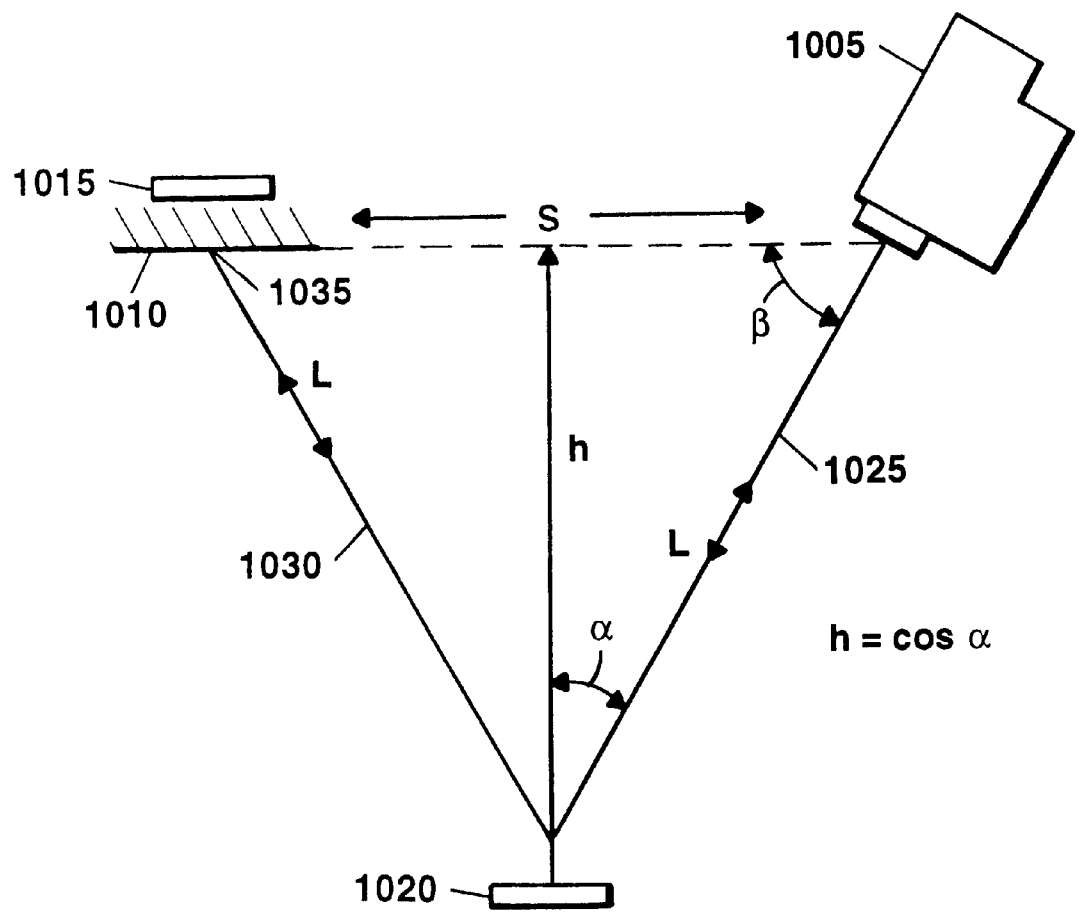
FIG. 10 illustrates the trigonometric relationships that may be used to calibrate the invention.

To attain the above advantages, the system needs to be initially calibrated. Several techniques can be used for calibrating the rangefinder system. Referring to FIG. 10, absolute positions may be determined by using the rangefinder 1005, a mirror 1020 and a retroreflector 1010. A linear sensor 1015 (preferably at least as accurate as the rangefinder 1005 is expected to be). The outgoing light beam 1025 is reflected from the reflector 1020 and light beam 1030 reaches retroreflector 1010. The retroreflected light beam returns along the path 1030 and 1025 as described above. The arrangement of FIG. 10 is described by the following equations:

$$\beta = \arccos (S/2L)$$

$$\alpha = \arcsin (S/2L)$$

The rangefinder 905 can be used to measure L, and the linear sensor 910 can be used to measure S, the distance from the rangefinder 1005 to the spot 1035 where the light beam impinges on the retroreflector 1010. There is no analogy to the above for finding absolute positions in the sensor system of FIGS. 1A–1C.

Moreover, modern rangefinders have a higher sampling rate than that available from the sensor system of FIGS. 1A–1C. Typical modern rangefinders are now capable of attaining 40 samples a second, and this number is only expected to improve. Consequently, the rangefinder also provides more accuracy with each sample, as the response time is faster than that of the conventional melt-level detection systems (for example, on the order of 2 minutes compared to 10 minutes).

While the invention has been shown and described above with respect to various preferred embodiments, it will apparent that the foregoing and other changes of the form and detail may be made therein by one skilled in the art without departing from the spirit and scope of the invention.

What is claimed is:

1. In a crystal growing system for growing crystal ingots from a melt, the melt having a surface, a melt-level detection system comprising:

measuring means for measuring, the time light takes to travel along a path including a segment from a measuring location to the melt surface, the time being indicative of a distance to the melt surface; and means, cooperating with the measuring means, for determining an average melt-level.

2. In a crystal growing system for growing crystal ingots from a melt, the melt having a surface, a melt-level detection system comprising:

a rangefinder oriented with respect to the melt to emit signals at the surface;

a retroreflector oriented with respect to the surface to receive signals emitted from the rangefinder and reflected by the surface and to reflect the received signal along a path parallel to the path the received signal traveled so that the rangefinder may receive signals reflected by the retroreflector and determine the distance traveled by the emitted signal.

3. The melt-level detection system of claim 2 wherein the crystal growing system includes a growth chamber and transition region and the rangefinder and retroreflector are positioned on the exterior of the growth chamber and transition region with respect to the melt and wherein the rangefinder and retroreflector communicate via signal-transparent view ports.

4. The melt-level detection system of claim 2 wherein the rangefinder is a laser rangefinder.

5. The melt-level detection system of claim 2 wherein the emitted signal reflects off the melt surface within an expected target area determined by expected characteristics of the melt surface and wherein the retroreflector is large enough to cover the target area.

6. The melt-level detection system of claim 2 wherein the rangefinder and the retroreflector are oriented at approximately 30 degrees from an axis that is orthogonal to the melt-level.

7. Detection apparatus for determining a melt-level in a crystal growing system, the crystal growing system including a crucible containing a melt having a surface which has ripples, the detection apparatus including:

rangefinder means for projecting a light beam at the melt surface so that the light beam reflects off the surface; and a retroreflector oriented to receive the light beam reflected off the surface and to redirect the received light beam along a parallel path back to the melt surface;

wherein the rangefinder means is oriented to receive the redirected beam reflected off the melt surface and wherein the rangefinder means includes means for analyzing the received beam to determine the distance traveled by the projected beam.

8. The detection apparatus of claim 7 wherein the crystal growing system includes a growth chamber having the crucible located in the interior of the chamber and having a transition region and wherein the rangefinder means and retroreflector are positioned on the exterior of the growth chamber and transition region and wherein the rangefinder and retroreflector optically communicate via view ports.

9. The detection apparatus of claim 7 wherein the projected light beam reflects off the melt surface within an expected target area determined by expected characteristics of the melt surface and wherein the retroreflector is large enough to cover the target area.

10. The detection apparatus of claim 7 wherein the rangefinder means and the retroreflector are oriented at approximately 30 degrees from an axis that is orthogonal to the melt-level.

* * * * *